United States Patent [19]

Paige

[11] 4,336,514
[45] Jun. 22, 1982

[54] ACOUSTIC WAVE DEVICES

[75] Inventor: Edward G. S. Paige, Horton-Cum-Studley, England

[73] Assignee: National Research Development Corporation, London, England

[21] Appl. No.: 188,284

[22] Filed: Sep. 18, 1980

[30] Foreign Application Priority Data

Sep. 20, 1979 [GB] United Kingdom ............... 7932716

[51] Int. Cl.$^3$ ...................... H03H 9/135; H03H 9/64
[52] U.S. Cl. .................................. 333/195; 333/153; 333/196
[58] Field of Search .............................. 333/150–155, 333/193–196; 310/313 R, 313 A, 313 B, 313 C, 313 D; 331/107 A; 330/5.5

[56] References Cited

U.S. PATENT DOCUMENTS

| | | | |
|---|---|---|---|
| 4,055,820 | 10/1977 | Solie | 333/153 |
| 4,146,852 | 3/1979 | Godfrey et al. | 333/153 X |
| 4,155,056 | 5/1979 | Cross et al. | 333/195 |
| 4,210,883 | 7/1980 | Shah et al. | 333/195 |
| 4,267,534 | 5/1981 | Tanski | 333/195 |

OTHER PUBLICATIONS

Solie–"A Saw Filter Using a Reflective Dot Array", 1976, Ultrasonics Symposium Proceedings, Anapolis, MD, U.S.A., Sep. 29–Oct. 1, 1976, pp. 309–312.

Primary Examiner—Marvin L. Nussbaum
Attorney, Agent, or Firm—Cushman, Darby & Cushman

[57] ABSTRACT

A surface acoustic wave reflective array of the kind in which parallel rows of scatterers produce Bragg reflection of an incident wave in a wanted direction at a given frequency determined by the row spacing. The rows (4) are formed of scattering centers, eg metallized dots (11) divisible into unit structures (10) each containing a group of at least two such centers; the orientation and relative spacings (in terms of the Bragg wavelength) of the centers within each unit, relative to the direction (Z) of an incident beam, are such that the scattered waves constructively interfere in the wanted direction (X) while avoiding constructive interference in other directions. The scattering centers of each unit structure may be in the same row or in adjacent rows. The invention alleviates a disadvantage of existing reflective dot arrays, which tend additionally to produce reflections in unwanted directions.

26 Claims, 6 Drawing Figures

ACOUSTIC WAVE DEVICES

This invention relates to Surface Acoustic Wave (SAW) devices and to similar devices in which bulk acoustic waves are propagated near the surface, and in particular to such devices incorporating reflective arrays.

SAW devices are known in which the frequency selectivity of reflective arrays placed in the path of the acoustic beam is used to influence the frequency response of the device. Such scattering arrays usually consist either of parallel grooves etched into the device substrate, as described in IEEE Transactions on Microwave Theory and Techniques, Vol MTT-21, No 4, April 1973 "The Use of Surface-Elastic-Wave Reflection Gratings in Large Time-Bandwidth Pulse-Compression Filters" by Williamson & Smith; or of parallel metallic strips, the array of grooves or strips extending across the width of the incident beam and being suitably inclined thereto to produce the desired angle of reflection.

The metallic strip reflective array has certain advantages over the reflective groove array in that the fabrication procedure is simpler, enabling the reflective arrays to be fabricated in the same metallization process as the input and output transducers. In most applications it is desirable to vary the strength of reflection from different grooves or strips within the array to provide amplitude weighting, and in the case of metallic strip array this cannot be done in a simple controllable manner.

To overcome this limitation of metallic strip arrays, while retaining its advantages, it has been proposed to replace each reflective metal strip with a row of metallic dots. Such an arrangement is described in Applied Physics Letters, Vol. 28, No 8, Apr. 15 1975 "Surface Acoustic Wave Reflective Dot Array (RDA)" by L P Solie, and enables the strength of reflection from each row of dots to be varied by varying the periodic spacing of the dots from row to row. This amplitude weighting of the array in combination with a variation of the periodic spacing of the rows within the array can be used to control its amplitude and phase response as a function of frequency in a manner described in the above Solie reference.

A disadvantage of known so-called reflective dot arrays is that in addition to producing a reflection of the incident beam in the required direction, they also tend to produce reflections in unwanted directions.

For example, a uniform periodic array constructed in accordance with the above Solie reference, designed to reflect waves through 90° in one direction (+90°) at a given frequency would also reflect equally strongly through 90° in the opposite direction (−90°), and would also reflect through 180°. These unwanted reflections remove energy from the beam, and complicate the wanted reflection.

It is an object of the present invention to overcome or at least substantially reduce this disadvantage in reflective arrays of the kind comprising a plurality of parallel rows of scatterers, in which the inclination of the rows, and the spacing between adjacent rows, with respect to the direction of an incident acoustic wave beam, is such as to produce Bragg reflection of the incident wave in a wanted direction at a given frequency.

According to the present invention, in a reflective array of the kind specified, the scatterers are so arranged as to produce an array of effective scattering centres, the local spacing between the scattering centres within the array being such that acoustic waves scattered from the individual scattering centres at the frequency at which said Bragg reflection occurs in the wanted direction from the row or rows in which those scattering centres are contained, constructively interfere in the direction of the wanted reflection, while avoiding constructive interference at this frequency in directions other than the wanted direction.

The condition for Bragg reflection is that the spacing of the rows containing the scattering centres in the direction of incidence (and also of reflection) is an integral number of half wavelengths at the desired frequency of reflection. In some cases, this spacing of the rows may be uniform throughout the array, so that the whole array produces Bragg reflection in the wanted direction at the same frequency, determined by the periodic spacing of the rows. Alternatively to vary the frequency characteristics of the array, the spacing between adjacent rows may vary locally from row-to-row within the array so that different regions of the array produce Bragg reflection of the incident beam at different frequencies.

In addition, the strength of reflection from different regions of the array may be varied by locally varying the number of scattering centres per unit length within each row of the array—the greater the number of scattering centres the greater will be the strength of the reflection. Hitherto, in known reflective arrays of the kind specified, the effective scattering centres are uniformly spaced within each row of the array, the periodic spacing of the centres in any row being determined solely by the strength of reflection, or amplitude weighting, required for that row, regardless of any interference conditions between the waves scattered from the individual scattering centres which may produce spurious reflections in other than the wanted direction.

However, in reflective arrays in accordance with the present invention, it is necessary in determining the spacing or density of the scattering centres within each row required to produce a given amplitude weighting, to also ensure that the local spacing of the scattering centres in the array satisfies the requirement to avoid reflections in other than the wanted direction.

According to a preferred aspect of the present invention, the scattering centres of the array are divisible locally into unit structures each containing a group of at least two scattering centres, the orientation of each unit structure, and the relative spacing of the scattering centres within each unit structure relative to the direction of the incident beam, being such that incident acoustic waves scattered by the scattering centres within that unit structure at the Bragg frequency determined by the inter-row spacing associated with the row or rows containing those scattering centres, constructively interfere in the wanted direction while also avoiding constructive interference in directions other than the wanted direction.

Thus, providing the whole reflective array can notionally be divided into a plurality of unit structures each satisfying the above requirements regarding its orientation with respect to the direction of the incident beam and the relative spacing between the scattering centres contained within it, then the array will produce Bragg reflection of the incident beam in the wanted direction, while also avoiding constructive interference in directions other than the wanted direction.

A uniform, unweighted periodic array can then be generated by a plurality of identical unit structures, arranged in rows parallel to the required rows of scatterers. In such an arrangement, the number of unit structures per unit length along each row will be the same for each row, and the spacing of the unit structures along each row may either be random or periodic.

As mentioned above, where it is required to vary the frequency characteristics of the array, this can be done by locally varying the amplitude weighting of the rows of scatterers and/or the periodic spacing between adjacent rows within the array.

To locally vary the amplitude weighting of the rows within the array, corresponding local variations are made to the number of unit structures per unit length in a direction parallel to the rows of scatterers, which in turn controls the number of scattering centres per unit length along these rows. Where the unit structures are periodically spaced along the rows, the amplitude weighting applied to different rows of the array may be varied simply by varying the periodic spacing of the unit structures associated with those rows.

Similarly, to vary the frequency at which Bragg reflection from different rows of scatterers within the array occurs, corresponding variations are made in the spacing between these rows.

Regarding the variation in spacing between the rows of the array as a scaling parameter, these variations in the spacing between the rows may be achieved by applying this scaling parameter to change the dimensions of the unit structures associated with those rows. Thus a one-to-one relationship is maintained between the separation of the rows and the size of the unit structures associated with those rows, and in particular the relative spacing between the scattering centres contained within each of the unit structures.

Where it is required to locally vary the frequency of the wanted Bragg reflection from different rows within the array as well as the amplitude weighting of these rows, this may be achieved by a combination of varying the scale of the unit structures associated with the different rows together with varying the number of appropriately scaled unit structures per unit length along the rows.

In a preferred embodiment of the present invention, the parallel rows of the array are inclined at an angle of approximately 45° to the incident beam whereby to reflect the beam through an angle of 90°. In such an arrangement, the local spacing of the scattering centres within the array (or the spacing of the scattering centres within each unit structure) may conveniently be such that waves scattered at the desired frequency of reflection from the scattering centres constructively interfere in the wanted direction (ie at an angle of +90° to the incident beam direction), and destructively interfere in directions at angles of +180° and −90° to the direction of the incident beam.

Preferably the scatterers of the array are in the form of metallic dots each defining one or more scattering centres according to its size and shape. The reflective array may then be formed in the same fabrication steps as those used to from interdigital input and output transucers. Alternatively, the scatterers may comprise etched holes, or non-conducting posts formed on the surface of the acoustic wave propagating medium.

The invention will now further be described by way of example only, with reference to the accompanying schematic drawings, of which.

Figure 1:
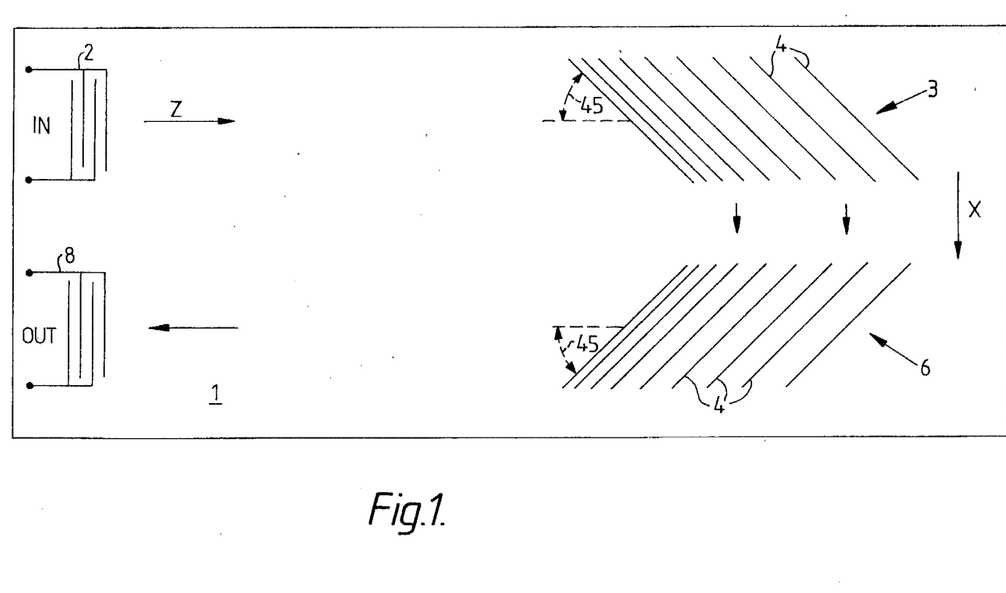
FIG. 1 is a plan view of an acoustic wave device of the kind to which the present invention may usefully be applied.

Referring to the drawings, the acoustic wave device shown in FIG. 1 comprises a piezoelectric substrate 1 carrying an interdigital-electrode input transducer 2 for launching an acoustic wave beam in a direction Z along the surface of the substrate towards a first reflective array 3. The reflective array 3 comprises a plurality of parallel rows 4 of spaced scatterers (for simplicity the rows are shown as continuous strips in this figure) arranged in the path of the incident beam and inclined thereto at an angle of approximately 45° (the precise angle being determined in known manner by the anistropy velocity of the propagating medium) to give a Bragg reflection of the incident beam through an angle of +90° towards the X direction. The spacing between adjacent rows 4 of the reflective array varies as a function of distance from the input transducer 1, so that the frequency at which incident waves are reflected by the array through the desired angle of +90°, correspondingly varies as a function of distance along the array in known manner. Strong reflections in the wanted direction are only produced in regions of the array at which the spacing of the rows in the direction of incidence matches the wavelength of the incident beam.

The waves reflected by the first reflective array 3 are received by a second reflective array 6 which, as shown, is an identical mirror-image of the first array 3 operating in a reciprocal mode, and returning the acoustic wave reflected onto it by the first array 3 to an output interdigital-electrode transducer 8. The periodic spacing between adjacent rows 4 of each reflective array 3,6, and the weighting applied to each row of the reflective arrays may be selected in known manner to provide a desired frequency response characteristic for the device as measured between the input and output transducers 2,8.

Although shown as continuous strips in FIG. 1, each row 4 of the reflective arrays 3,6 actually comprises a row of discrete scatterers each provided by a metallic dot deposited on the surface of the substrate 1, each dot defining one or more effective scattering centres depending upon its size and shape. For example, a symmetrical dot (such as a round or square dot, having roughly equal dimensions in all directions) having a size which is small compared to a wavelength at its desired frequency of reflection, (ie less than one wavelength), will effectively behave substantially as a point scattering centre providing it is spaced far enough apart from its neighbours so that there is no coupling between them. By varying the shape of the reflective dot, for example, by increasing its dimension in one direction, it may be adapted to behave effectively as more than one scattering centre, although the coupling between the scattering centres produced by such dots must normally be taken into account.

In conventional reflective dot arrays, the individual dots of each row are evenly spaced, their spacing determining the weighting of that row irrespective of other considerations.

However, this tends to produce spurious reflections of the incident wave in directions other than the wanted direction as discussed above, and in accordance with the present invention, this problem is reduced by appropriate local spacing of the scattering centres to ensure that such unwanted reflections are suppressed.

Figure 2:
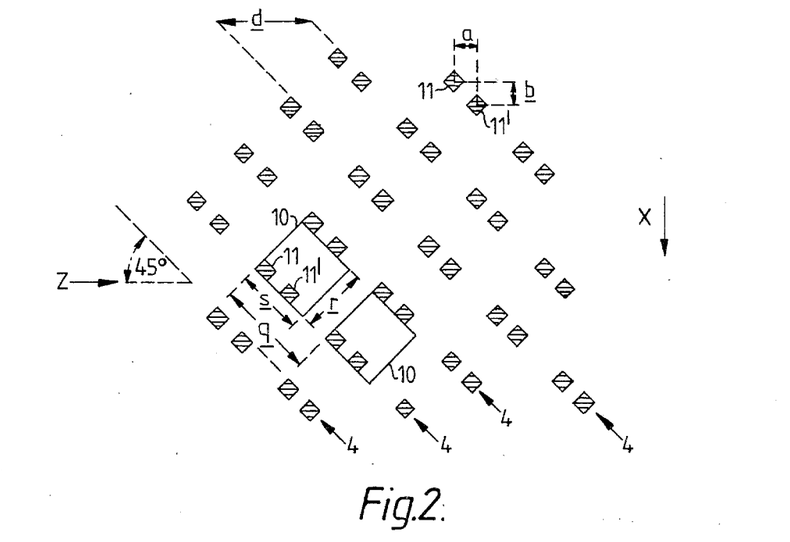
FIG. 2 is a plan view of part of a first acoustic wave reflective array in accordance with the present invention.

FIG. 2 shows part of a uniform reflective array in accordance with the present invention comprising a number of parallel rows 4 of scatterers 11 inclined at an angle of approximately 45° with respect to the direction Z of an incident acoustic beam, to reflect the beam through 90° towards the X direction. Each scatterer 11 is in the form of a square metallic dot, the dimension of which in the Z direction is approximately a quarter of a wavelength at the frequency of the desired Bragg reflection (hereafter referred to simply as the Bragg frequency). Each dot 11 may thus be treated as a point scattering centre positioned at the centre of the dot. The pattern of the array may be considered as an array of identical unit structures 10, each containing a pair of dots 11, 11' which define two scattering centres the relative spacings a, b of which, relative to the Z and X directions respectively, both correspond to a quarter of a wavelength at the Bragg frequency. The dimension r of the unit structures 10 in a direction perpendicular to the rows 4 determines the periodic spacing d between the rows 4, while the dimension s in a direction parallel to the rows 4 is selected to represent the minimum desirable spacing (suitably about one scatterer width as shown, or about a quarter-wavelength) between the unit structures 10 in this direction.

The frequency at which Bragg reflection occurs is determined by the periodic spacing d relative to the Z direction between the rows 4 of scattering centres, which in the present example corresponds to one wavelength at this frequency ($a=b=d/4$.)

This configuration ensures that the path difference introduced between surface waves scattered by the individual dots in the unit structure in the direction X is zero, the condition for constructive interference, while also satisfying the condition for destructive interference in the $-Z$ direction ($-180°$) and the $-X$ direction ($-90°$).

Figure 3:
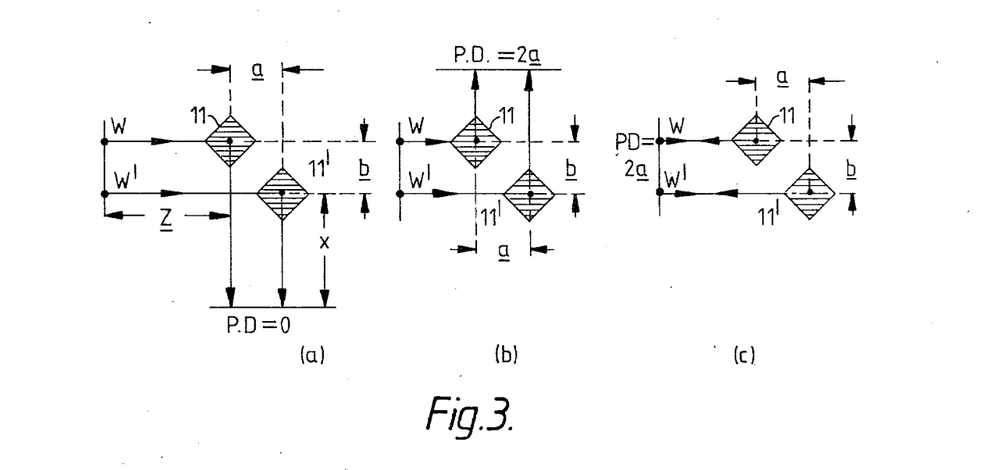
FIG. 3 illustrates the principle of operation of the reflective array shown in FIG. 2.

This is illustrated in FIG. 3 (a) in which the total path difference between waves W,W' incident respectively on the two dots 11,11' in a unit structure 10 and scattered in the X direction, is $(z+b+x)-(z+a+x)=0$ for isotropic propagation, although for an anisotropic medium, some correction to these dimensions must be made. FIGS. 3(b) and 3(c) illustrate the destructive interference condition for waves scattered in the $-X$ direction ($-90°$) and the $-Z$ direction ($+180°$) respectively, in which the path difference introduced between the waves scattered by the two dots 11, 11' in the unit structure is $2a-\lambda/2$ in each case.

It will be noted that the concentration of scatterers 11 within each row 4 is determined by the (as shown, periodic) spacing q between the unit structures 10 along the rows, while the periodic spacing between the rows is related to the dimension r of the unit structures. Thus, if it is required to vary the amplitude weighting of the rows, this can simply be achieved by appropriately varying the periodic spacing q of the unit structures 10 from row-to-row to achieve a desired amplitude weighting characteristic for the array, while maintaining a fixed relative spacing between the individual scattering centres within each unit structure 10. Further, if it is required to vary the frequency of the 90° Bragg reflection, this is achieved by appropriate scaling of the entire unit structure, whereby to increase the spacing between the rows 4 while maintaining a fixed local relationship between the relative spacings a, b between the scattering centres in each unit structure and the spacing between the rows 4 associated with these unit structures. In the part of the array shown in FIG. 2, the amplitude weighting of the rows 4 is uniform, as is the spacing d between the rows. The amplitude weighting of the rows may be increased by reducing the periodic spacing q of the unit structures 10, up to a limit determined by the dimension s of the unit structures. Of course, this limit does not necessarily represent an absolute limit, the periodic spacing q of the unit structures 10 along any row may be reduced beyond the desired limiting value s, so that adjacent unit structures overlap, but this is likely to cause coupling between the scattering centres of adjacent unit structures which must then be taken into consideration.

Figure 4:
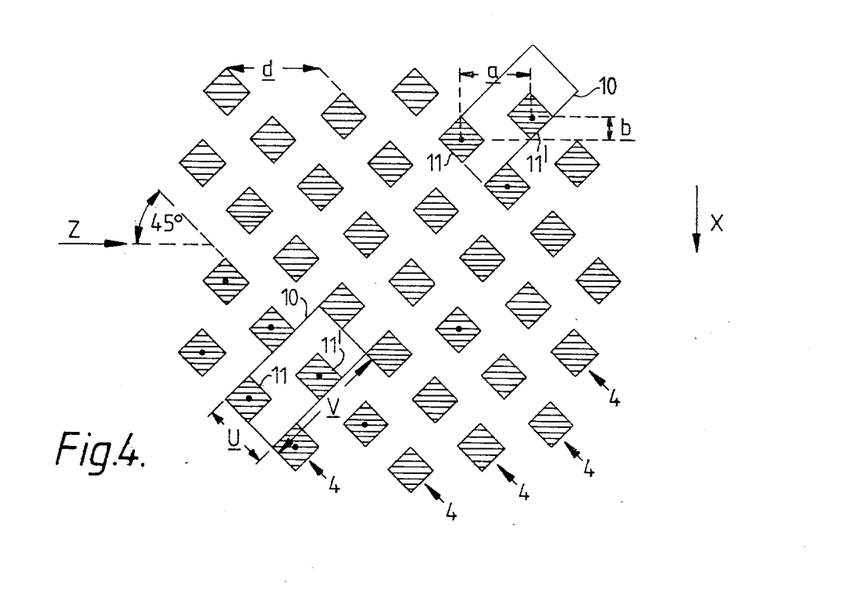
FIGS. 4 and 5 are plan views of respective second and third reflective arrays in accordance with the present invention.

FIG. 4 shows part of another form of reflective array, which may be regarded as an array of unit structures 10 of a different kind, having dimensions u, v and each containing two scattering dots 11, 11', but the two dots 11, 11' are contained in adjacent rows 4 of the array. The dimension v of the unit structure 10 thus corresponds to twice the periodic spacing between the rows 4, while the dimension u corresponds both to the periodic spacing of the rows, and also to the spacing of the dots in each row. Again this dimension u represents the minimum desirable spacing of the unit structures 10 along the rows to avoid coupling between the scattering centres of adjacent units. The periodic spacing d of the rows 4 in the Z direction is set to correspond to one wavelength at the frequency at which the desired Bragg reflection in the X direction occurs for incident acoustic waves in the $+Z$ direction, while the relative spacings a,b of the dots 11,11' within each unit cell 10 are selected to be $1\frac{1}{4}$ and $\frac{1}{4}$ of a wavelength respectively such that acoustic waves incident in the $+Z$ direction and scattered by these dots, constructively interfere in the $+X$ direction, and destructively interfere in the $-X$ and $-Z$ directions at the frequency of the Bragg reflection.

As shown, the dimension of the individual dots 11,11' in the Z direction corresponds in this example to half a wavelength at the desired frequency of reflection, although this dimension is not critical, and a similar effect could be achieved using symmetrical dots of any suitable size, having a dimension say, corresponding to a quarter wavelength, but at least less than one wavelength at the Bragg frequency.

Figure 5:
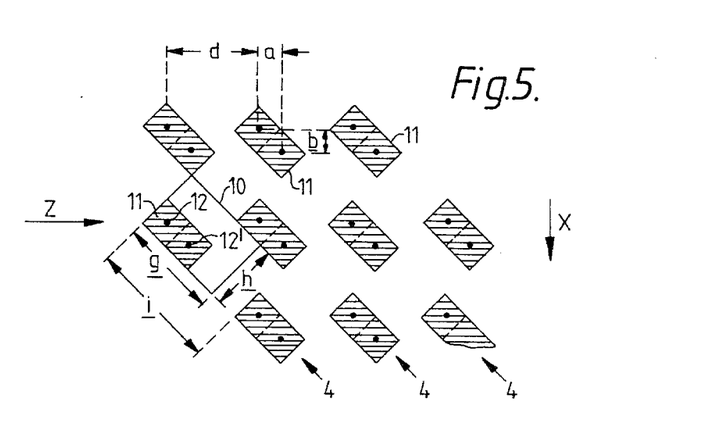

FIG. 5 shows a further form of uniform reflective array in accordance with the invention in which each unit structure contains a single rectangular metallic dot 11 which entity, by virtue of its non-symmetrical shape defines two scattering centres indicated by points 12,12'. The dimension h of the unit structure 10 corresponds again to the spacing of the rows of dots 11, while dimension g corresponds to the minimum desirable spacing of the unit structure along the rows. As shown, the spacing i between the unit structures is greater than the dimension g, indicating that some reduction of the amplitude weighting has been introduced. The relative spacings a, b between the two scattering centres in each unit cell 10 are both selected to be ¼ wavelength, such that at the frequency at which the periodic spacing d of the rows 4 in the Z direction corresponds to one wavelength, waves scattered from these scattering centres at this frequency constructively interfere in the X direction, and destructively interfere both in the −X and in the −Z directions.

As discussed earlier in connection with the array shown in FIG. 2, local variations in the amplitude weighting of the rows 4 in both the FIG. 4 and the FIG. 5 arrays can be achieved simply by varying the spacing of the unit structures concerned along the axis parallel to the rows while maintaining the spacings a and b between the scattering cells within those unit cells constant. Similarly, local variations in the frequency at which Bragg reflection occurs may be achieved by appropriate scaling of the unit structures 10 in dependence upon the Bragg wavelength.

Figure 6:
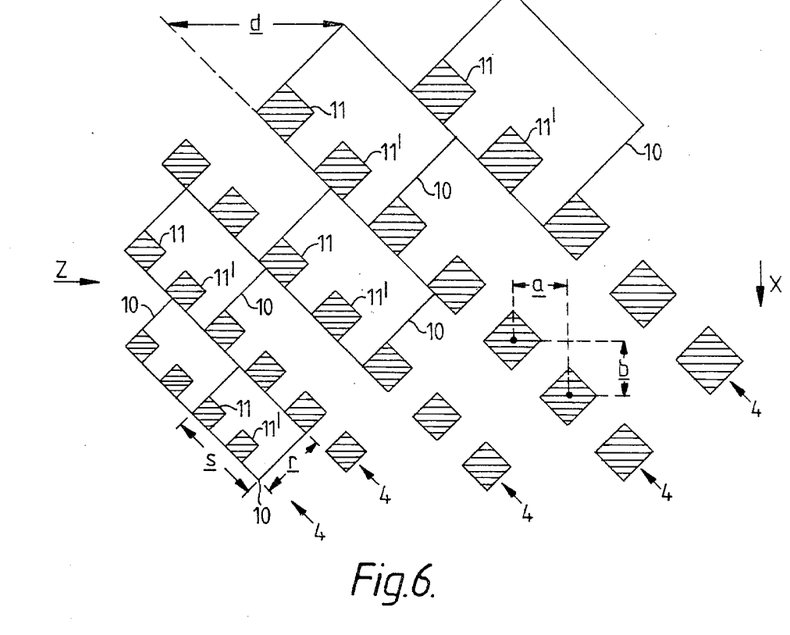
FIG. 6 is a plan view of part of a modified form of the acoustic wave reflective array shown in FIG. 2.

The manner in which these variations may be achieved in an array of the kind shown in FIG. 2, is illustrated in FIG. 6, in which the frequency at which the Bragg reflection occurs in the X direction progressively decreases in the Z direction. The rate at which this variation occurs from row to row has been exaggerated for illustrative purposes only, and for such a small part of a practical array, the actual variation in the dimensions concerned from row to row normally would be hardly discernable. As shown, the scale of the unit structures 10 increases from row to row in the Z direction, thereby progressively reducing the frequency at which reflections from the rows occur along the array.

It will be noted that in FIG. 6, as the scale of the unit structures progressively increases, so does the size of each scattering dot 11. While it is preferred to maintain a fixed relationship between the dot size and the spacing of the rows 4 to avoid introducing a consequential variation in the weighting, this need not necessarily be the case, and the dot size may remain uniform throughout the array. Similar considerations may be applied to the types of array shown in FIGS. 4 and 5 to achieve any desired frequency characteristic for the array.

While a reflective array in accordance with the present invention will avoid reflections of the incident beam in directions other than the wanted direction at the Bragg frequency, it may nevertheless introduce reflections in unwanted directions at other than the Bragg frequency. The frequencies and directions in which these unwanted reflections occur will depend upon the form of array. For example, the array shown in FIG. 2 produces an unwanted reflection at about 1.6 times the Bragg frequency, while none occur at frequencies below the Bragg frequency. The array shown in FIG. 4 is somewhat worse than this, producing unwanted reflections at 0.83 and 1.30 times the Bragg frequency. Thus, by appropriate design of the array, the effects of these unwanted reflections off the Bragg frequency can be minimised, eg by ensuring they do not occur within the operating bandwidth of the device.

However, in some applications, the power losses associated with these "unwanted" reflections may be usefully employed in designing a specified filter response characteristic, for example to reinforce traps in the passband of a frequency filter.

Further, the spacing of the unit structures 10 along a row is relatively unimportant in the suppression of reflections in unwanted directions at the Bragg frequency, and their spacing may even be randomised. However, the spacing of the unit structures can affect the strength of reflections in unwanted directions at other than the Bragg frequency. Periodic spacing of the unit structures along a row will tend to enhance the strength of such reflections, while randomising their spacing will tend to weaken them. Again this provides a further parameter which may usefully be applied to modify the overall filter response.

Many modifications may be made to the described embodiments within the scope of the present invention. For example, the unit structures may, within reasonable limits, contain any number of scattering centres providing that the relative spacing of the individual scattering centres within each unit structure obeys the condition for constructive interference in the direction of the wanted reflection at a frequency determined by the periodic spacing of the rows concerned. Furthermore, the number of scattering centres within the unit structures, and their configuration therein, may vary within the array, ie the entire array need not necessarily be composed of unit structures containing the same number or configuration of scattering centres.

As shown in FIG. 1, the device comprises two identical reflective arrays adapted to reflect an incident beam from an input transducer to an output transducer, but the two reflective arrays need not be identical. Furthermore, a device in accordance with the invention may have only one reflective array, or more than two reflective arrays, adapted to reflect an incident acoustic beam from an input tranducer to an appropriately positioned output transducer.

Although the metallic dots which define the scattering centres of the described arrays are shown for convenience to have a square shape, their actual shape is not important, although desirably they should all be of substantially the same shape throughout the array. Furthermore, while it is usually more convenient for fabrication purposes to use metallised dots to define the scattering centres, etched holes or non-conducting posts deposited on the surface of the propagating medium may alternatively be used.

The invention may also be applied in reflective arrays adapted to reflect through angles other than 90°, the spacing of the scattering centres being appropriately selected to achieve the required constructive interference condition in the direction of the wanted Bragg reflection, while avoiding constructive interference in other than the wanted direction.

I claim:

1. In a surface acoustic wave (SAW) device including input means for generating acoustic waves, output means for delivering a signal from the device and a frequency-selective reflective array which comprises a plurality of parallel rows of individual scatterers, each scatterer forming one or more scattering centres from which acoustic waves, generated by the input means and propagated to the array, are scattered in a desired predetermined direction by Bragg reflection, the improvement consisting essentially of and in combination with the above elements:

the scatterers being disposed such that the local spacing between scattering centres, in relation to the acoustic wavelength at the frequency at which Bragg reflection occurs in the desired direction, said Bragg reflection frequency being determined by the inter-row spacing associated with the row or rows containing those scattering centres, causes the acoustic waves scattered from the individual scattering centres at the Bragg reflection frequency to constructively interfere in the desired predetermined direction and to not constructively interfere in directions other than the desired direction.

2. An improvement according to claim 1 wherein the scattering centres of the array are grouped locally into unit structures each containing a group of at least two scattering centres, the orientation of each unit structure, and the relative spacing of the scattering centres within each unit structure relative to the direction of the incident beam, being such that incident acoustic waves scattered by the scattering centres within that unit structure at the Bragg reflection frequency determined by the inter-row spacing associated with the row or rows containing those scattering centres, constructively interfere in the desired direction while also avoiding constructive interference in directions other than the desired direction.

3. An improvement according to claim 2 wherein each unit structure includes scattering centres in at least two adjacent rows.

4. An improvement according to claim 2 or 3 wherein the spacing of the unit structures in a direction parallel to the rows is periodic.

5. An improvement according to claim 2 or 3 wherein the spacing of the unit structures in a direction parallel to the rows is random.

6. An improvement according to claim 2 or 3 wherein different rows of scatterers within the array have different amplitude weightings, and wherein said different weightings are provided by corresponding variations in the number of unit structures per unit length in a direction parallel to the rows.

7. An improvement according to claim 2 or 3 wherein the spacings between different rows of scatterers vary to produce corresponding variations in said Bragg reflection frequency, and wherein at least the relative spacing between the scattering centres within each of the unit structures associated with those rows is scaled in accordance with the corresponding inter-row spacings.

8. An improvement according to claim 1 wherein the parallel rows of the array are inclined, in use, at an angle of approximately 45° to an incident beam generated by said input means whereby to reflect the beam through an angle of approximately 90°, and wherein the local spacing of the scattering centres within the array is such that waves scattered at the Bragg reflection frequency from the scattering centres constructively interfere at an angle of approximately +90° to the incident beam direction, and destructively interfere in directions of approximately −180° and −90° to the incident beam direction.

9. An improvement according to claim 2 or 3 wherein the parallel rows of the array are inclined, in use, at an angle of approximately 45° to an incident beam generated by said input means whereby to reflect the beam through an angle of approximately 90°, and wherein the spacing of the scattering centres within each unit structure of the array is such that waves scattered at the Bragg reflection frequency from the scattering centres constructively interfere at an angle of approximately +90° to the incident beam direction, and destructively interfere in directions of approximately +180° and −90° to the incident beam direction.

10. An improvement according to claim 9 wherein each unit structure comprises two scattering centres spaced apart in the same row, the two centres being effectively spaced approximately a quarter wavelength apart at the Bragg reflection frequency both in the direction of the incident beam and in the direction normal to said beam.

11. An improvement according to claim 9 wherein each unit structure comprises two scattering centres in adjacent rows with the centres in each row aligned between the centres in the two adjacent rows, the two centres being effectively spaced approximately one-and-a-quarter wavelengths apart at the Bragg reflection frequency in the direction of the incident beam and a quarter of a wavelength apart in the direction normal to said beam.

12. An improvement according to claim 9 wherein each unit structure comprises a single scattering entity extending sufficiently along a single row to define two scattering centres within itself, the two centres being effectively spaced approximately a quarter wavelength apart at the Bragg reflection frequency both in the direction of the incident beam and in the direction normal to said beam.

13. An improvement according to claim 1, 2 or 3 wherein the scatterers are formed by metallic dots, holes, or nonconducting posts, each defining one or more scattering centres.

14. A surface acoustic wave (SAW) device, comprising:
   a substrate for propagating surface acoustic waves;
   an input transducer, integrated onto the substrate for generating surface acoustic waves in response to an input signal coupled to the SAW device;
   a frequency-selective reflective array for receiving surface acoustic waves generated by the input transducer and propagated along the substrate, and (b) Bragg reflecting them in a predetermined desired direction, the array comprising a plurality of rows of individual scatterers, each scatterer forming one or more scattering centres;
   the scatterers being disposed such that local spacing between scattering centres, in relation to the acoustic wavelength at the frequency at which Bragg reflection occurs in the desired direction said Bragg reflection frequency being determined by the inter-row spacing associated with the row or rows containing those scattering centres, causes the acoustic waves scattered by individual scattering centres at the Bragg reflection frequency to constructively interfere in the desired direction and to not constructively interfere in directions other than the desired direction; and
   an output transducer, integrated onto said substrate for (a) receiving acoustic surface waves reflected by the array and propagated by the substrate and (b) generating an output signal of the SAW device.

15. A surface acoustic wave (SAW) device according to claim 14 wherein the scattering centres of the array are grouped locally into unit structures each containing a group of at least two scattering centres, the orientation of each unit structure, and the relative spacing of the scattering centres within each unit structure relative to the direction of the incident beam being such that incident acoustic waves scattered by the scattering centres within that unit structure at the Bragg reflection frequency determined by the inter-row spacing associated with the row or rows containing those scattering centres, constructively interfere in the desired direction while not constructively interferring in directions other than the desired direction.

16. A surface acoustic wave (SAW) device according to claim 15 wherein each unit structure includes scattering centres in at least two adjacent rows.

17. A surface acoustic wave (SAW) device according to claim 15 or 16 wherein the spacing of the unit structures in a direction parallel to the rows is periodic.

18. A surface acoustic wave (SAW) device according to claim 15 or 16 wherein the spacing of the unit structures in a direction parallel to the rows is random.

19. A surface acoustic wave (SAW) device according to claim 15 or 16 wherein different rows of scatterers within the array have different amplitude weightings, wherein said different weightings are provided by corresponding variations in the number of unit structures per unit length in a direction parallel to the rows.

20. A surface acoustic wave (SAW) device according to claim 15 or 16 wherein (a) the spacings between different rows of scatterers are varied to produce corresponding variations in said Bragg reflection frequency, and (b) at least the relative spacing between the scattering centres within each of the unit structures associated with those rows is scaled in accordance with the corresponding inter-row spacings.

21. A surface acoustic wave (SAW) device according to claim 14 wherein (a) the parallel rows of the array are inclined, in use, at an angle of approximately 45° to an incident beam generated by said input means to thereby reflect the beam through an angle of approximately 90°, and (b) the local spacing of the scattering centres within the array is such that waves scattered at the Bragg reflection frequency from the scattering centres constructively interfere at an angle of approximately +90 to the incident beam direction, and destructively interfere in directions of approximately −180° and −90° to the incident beam direction.

22. A surface acoustic wave (SAW) device according to claim 15 or 16 wherein (a) the parallel rows of the array are inclined, in use, at an angle of approximately 45° to an incident beam generated by said input means to thereby reflect the beam through an angle of approximately 90°, and (b) the spacing of the scattering centres within each unit structure of the array is such that waves scattered at the Bragg reflection frequency from the scattering centres constructively interfere at an angle of approximately +90° to the incident beam direction, and destructively interfere in directions of approximately +180° and −90° to the incident beam direction.

23. A surface acoustic wave (SAW) device according to claim 22 wherein each unit structure comprises two scattering centres spaced apart in the same row, the two centres being effectively spaced approximately a quarter wavelength apart at the Bragg reflection frequency both in the direction of the incident beam and in the direction normal to said beam.

24. A surface acoustic wave (SAW) device according to claim 22 wherein each unit structure comprises two scattering centres in adjacent rows with the centres in each row aligned between the centres in the two adjacent rows, the two centres being effectively spaced approximately one-and-a-quarter wavelengths apart at the Bragg reflection frequency in the direction of the incident beam and a quarter of a wavelength apart in the direction normal to said beam.

25. A surface acoustic wave (SAW) device according to claim 22 wherein each unit structure comprises a single scattering entity extending sufficiently along a single row to define two scattering centres within itself, the two centres being effectively spaced approximately a quarter wavelength apart at the Bragg reflection frequency both in the direction of the incident beam and in the direction normal to the beam.

26. A surface acoustic wave (SAW) device according to claim 14, 15 or 16 wherein the scatterers are formed by metallic dots, holes, or nonconducting posts, each defining one or more scattering centres.

* * * * *